(12) United States Patent
Kosonocky et al.

(10) Patent No.: US 8,593,171 B2
(45) Date of Patent: Nov. 26, 2013

(54) POWER SUPPLY MONITOR

(75) Inventors: Stephen V. Kosonocky, Fort Collins, CO (US); Gregory K. Chen, Ann Arbor, MI (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 529 days.

(21) Appl. No.: 12/950,584

(22) Filed: Nov. 19, 2010

(65) Prior Publication Data

US 2012/0126847 A1    May 24, 2012

(51) Int. Cl.
*G01R 31/40* (2006.01)
(52) U.S. Cl.
USPC ................................ 324/764.01
(58) Field of Classification Search
None
See application file for complete search history.

(56) References Cited

U.S. PATENT DOCUMENTS

2005/0259239 A1* 11/2005 Lin et al. ............... 356/5.01
2011/0074398 A1* 3/2011 Barton et al. ............ 324/133

OTHER PUBLICATIONS

Franch, R., et al., "On-chip Timing Uncertainty Measurements on IBM Microprocessors," 2007 IEEE International Test Conference, Oct. 21-26, 2007, pp. 1-7.
Nikolic, Borivoje, et al., "Sense Amplifier-Based Flip-Flop," 1999 IEEE International Solid-State Circuits Conference, Feb. 15-17, 1999, pp. 282-283 and 468.
Pant, Sanjay and Blaauw, David, "An Active Decoupling Capacitance Circuit for Inductive Noise Suppression in Power Supply Networks," 2006 International Conference on Computer Design, Oct. 1-4, 2007, pp. 168-173 (6 pages).
Petersen, Rex, et al., "Voltage Transient Detection and Induction for Debug and Test," 2009 IEEE International Test Conference, Nov. 1-6, 2009, pp. 1-10.

* cited by examiner

*Primary Examiner* — Minh N Tang
(74) *Attorney, Agent, or Firm* — Abel Law Group, LLP

(57) ABSTRACT

Power supply variations and jitter are measured by monitoring the performance of a ring oscillator on a cycle-by-cycle basis. Performance is measured by counting the number of stages of the ring oscillator that are traversed during the clock cycle and mapping the number of stages traversed to a particular voltage level. Counters are used to count the number of ring oscillator revolutions and latches are used to latch the state of the ring oscillator at the end of the cycle. Based on the counters and latches, a monitor output is generated that may also incorporate an adjustment for a reset delay associated with initializing the ring oscillator and counters to a known state.

25 Claims, 12 Drawing Sheets

POWER SUPPLY MONITOR

BACKGROUND

1. Field of the Invention

This invention relates to monitoring power supply variations.

2. Description of the Related Art

Power supply variations due to IR drop and Ldi/dt events can cause data retention failures in state-holding elements and timing failures in statistically critical paths. Clock jitter similarly influences timing yield. As levels of integration continue to increase and timing paths become ever more critical, monitoring such variations can be important in assuring reliable system debug and operation.

SUMMARY OF EMBODIMENTS OF THE INVENTION

In an embodiment an apparatus includes a ring oscillator including a plurality of serially coupled stages. Storage elements store respective values of stages at the end of a measurement period. At least one counter counts a number of ring oscillator revolutions during the measurement period. An encoder provides an encoder output according to the at least one counter and the storage elements, the encoder output indicative of a number of stages in the ring oscillator traversed by an oscillation signal during the measurement period.

In another embodiment a method is provided that includes, during a measurement period, counting a number of revolutions of an oscillation signal through the ring oscillator in one or more counters. Responsive to an end of the measurement period, the power supply monitor stores a value representative of a state of each stage of the ring oscillator and generates an output signal indicative of a number of stages through which an oscillation signal has traversed during the measurement period using the latched values of the ring oscillator stages and a count value from one of the one or more counters.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

In one or more embodiments of the invention, power supply noise and jitter are measured by monitoring the performance of a ring oscillator on, e.g., a cycle-by-cycle basis. Performance is measured by counting the number of stages of the ring oscillator that are traversed during, e.g., one clock cycle. Power supply droops will slow the ring oscillator down, resulting in fewer gate transitions and inversely, supply overshoots increase oscillator speed and therefore the number of stages traversed in a clock cycle. Clock jitter affects the time between clock edges, giving the transition more or less time to propagate around the ring oscillator. These trends allow the ring oscillator state at the end of each clock cycle to be mapped to power supply noise and clock jitter. Temperature and process variation may also affect the power supply monitor (PSM) output. In some embodiments the monitoring provides a trigger for adaptive mechanisms responsive to variations in the power supply.

In systems with low skew, changes in the monitor output are predominantly caused by power supply noise. In systems with higher skew changes, clock jitter may provide a more significant contribution to variations in the monitor output. Process and temperature variations also affect the monitor output. Process offset is static but temperature offset is dynamic with a large time constant. Note that for more accurate mapping of PSM output to supply voltages, those effects may be removed through calibration as described further herein.

Figure 1:
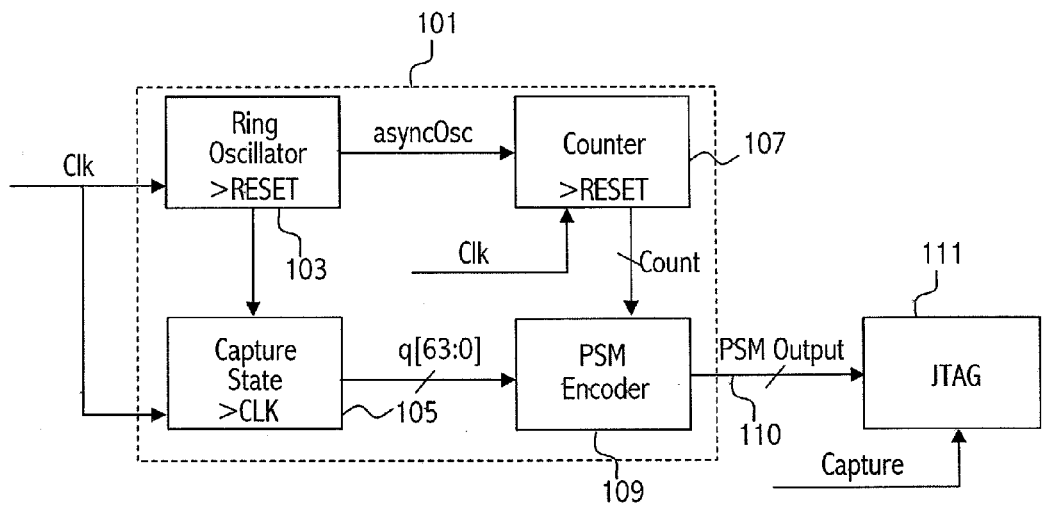
FIG. 1 illustrates a high-level block diagram of an exemplary power supply monitor (PSM) according to an embodiment of the invention.
Figure 2:
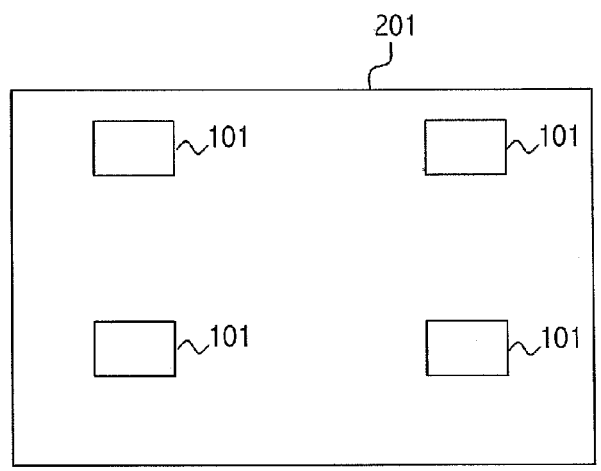
FIG. 2 illustrates an embodiment in which multiple PSMs are utilized on an integrated circuit.

Referring to FIG. 1, illustrated is an exemplary power supply monitor (PSM) 101 that includes a ring oscillator 103. The monitor 101 measures the number of stage transitions in the ring oscillator during each measurement period, e.g., a clock cycle. Note that while multiple clock cycles or portions thereof may constitute the measurement period, for convenience of discussion, a single clock cycle will be assumed to be the measurement period. In an embodiment the ring oscillator and counters are reset on the leading clock edge. Capture logic 105 captures the state of the ring oscillator at the end of the clock cycle. The counter logic 107 tracks the number of ring oscillator (RO) revolutions in one clock cycle. That data in turn is supplied to the encoder 109 that supplies a PSM output based on the state of the ring oscillator and the number of ring oscillator revolutions at the end of the cycle. Note that higher resolution requires a long string of delay elements that can be provided with a relatively short ring of delay elements if the revolutions of the ring oscillator are counted. Referring to FIG. 2, multiple monitors 101 may be utilized on an integrated circuit 201 to monitor voltage transients in different portions of the integrated circuit.

Figure 3:
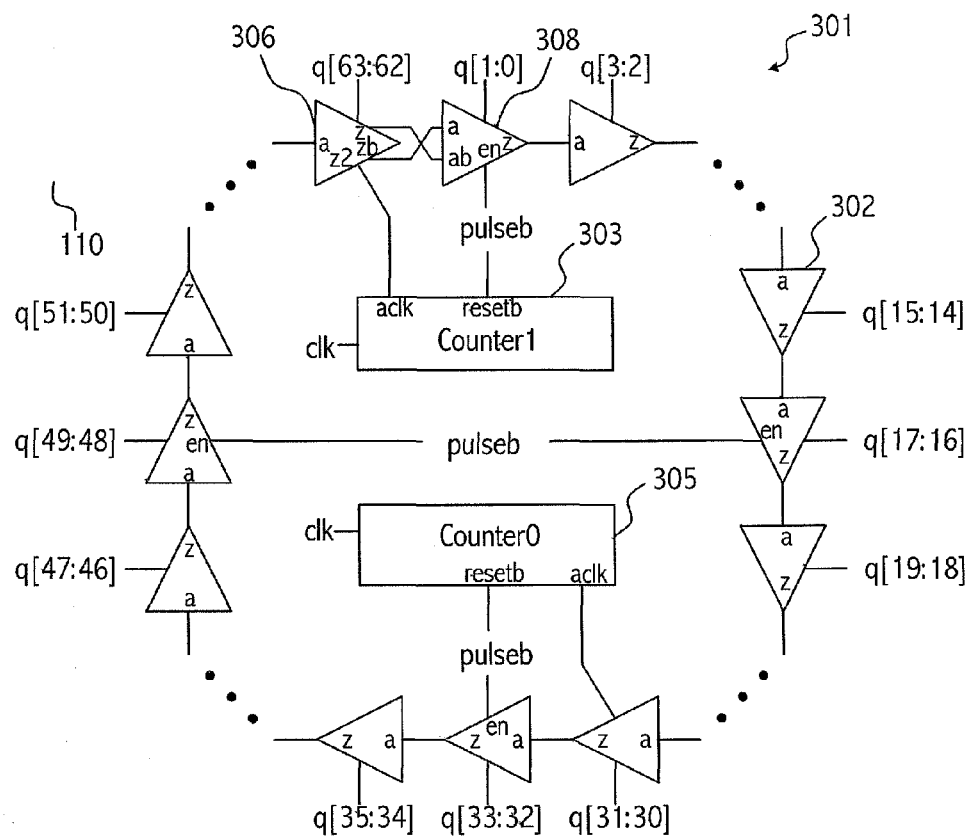
FIG. 3 illustrates additional details of a ring oscillator according to an embodiment of the invention.
Figure 4:
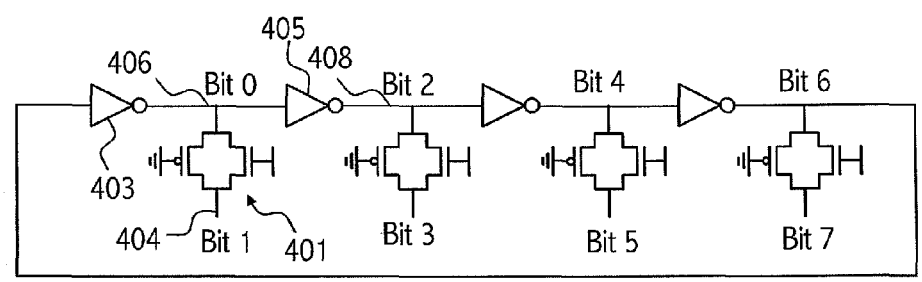
FIG. 4 illustrates an embodiment using passive interpolation by using transmission gates between oscillator stages to achieve higher resolution.

FIG. 3 illustrates additional details of an embodiment of the ring oscillator. In the embodiment shown in FIG. 3, the ring oscillator 301 has 32 stages, each stage including a delay element and latches as described more fully herein. In the illustrated embodiment, each oscillator stage provides two bits of information to provide higher resolution to measure the voltage using the ring oscillator. Passive interpolation using transmission gates is used in the illustrated RO to achieve sub-gate-delay time resolution, corresponding to higher voltage resolution. As shown in FIG. 4, series transmission gates 401 connect adjacent nodes 403 and 405 in the RO. The embodiment shown in FIG. 4 is single-ended, while other embodiments may be differential. The intermediate node at 401 transitions at a time between transitions of the adjacent nodes 403 and 405 and is latched at the end of each clock cycle. The transition order of the bits is shown in FIG. 4. Thus, bit 0 transitions before bit 1, bit 2 before bit 3, etc. This technique roughly doubles the time and voltage resolution of the PSM. In other embodiments, the series transition gates are omitted to save area.

Two counters 303 and 305 record the number of RO revolutions in each clock cycle. In the illustrated embodiment, each counter is clocked by the positive edge of a node in the RO and increments once every two RO revolutions. One counter is placed on either end of the RO to avoid errors due to transition glitches and metastability. The valid counter is determined by the RO state at the end of the clock cycle and is the counter that has transitioned least recently. In one embodiment, the counters are implemented as linear feedback shift registers (LFSR) and the LFSR values are converted to a binary number in an encoder stage (see 109 in FIG. 1). In an embodiment, the valid counter determines the MSBs of the PSM output 110.

Figure 5:
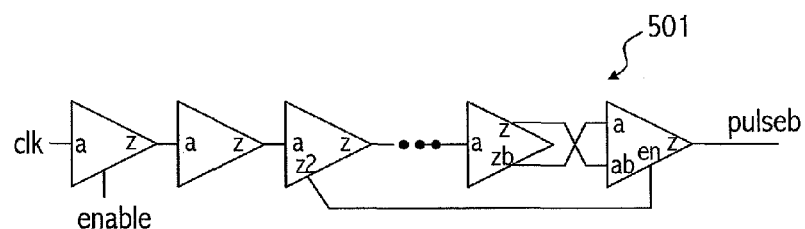
FIG. 5 illustrates an exemplary reset circuit for use with the ring oscillator of FIG. 3.

In addition to the ring oscillator, FIG. 5 illustrates a pulse generator 501 that generates a pulse (pulseb) during the initial portion of the clock cycle to initialize the ring oscillator and the counters to a known state. At the beginning of each clock cycle, the counters and RO are reset to create a deterministic starting point. The pulse generator (PG) is created using dummy delay elements (DDEs) with the same nominal delay and response to power supply variations as the delay elements in the RO. In an embodiment, the pulse generator is configured to provide a pulse having a delay equal to the delay of one RO revolution, and this delay is accounted for in the encoding of the PSM output. In the illustrated embodiment, the pulse resets the RO from four different locations to decrease reset latency. In an embodiment, flip-flops with asynchronous set capabilities are used in the LFSR counters.

The state of the RO at the end of each clock cycle is recorded by latching the value of each stage in the RO. The following PSM encoder stage 109 converts the level-sensitive thermometer code, reflecting the state of the RO, to a binary number and determines the LSBs of the PSM output. The encoding scheme ensures that the PSM MSB increments when the PSM LSBs roll over. That is accomplished by using $2^n$ differential delay elements in the RO. The inputs to one delay element are crossed to determine the starting point for oscillations as shown for stages 306 and 308, where the positive output z of stage 306 connects to the negative input ab, and the negative output zb connects to the positive input a. The use of differential delay elements also enables the use of sense-amp type flip-flops instead of master-slave flops to more accurately capture transition phase information.

Figure 6A:
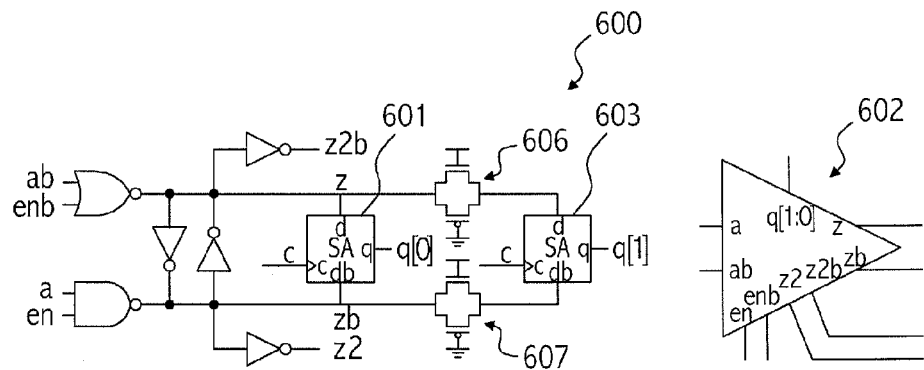
FIG. 6A illustrates an exemplary delay element in the ring oscillator.
Figure 6B:
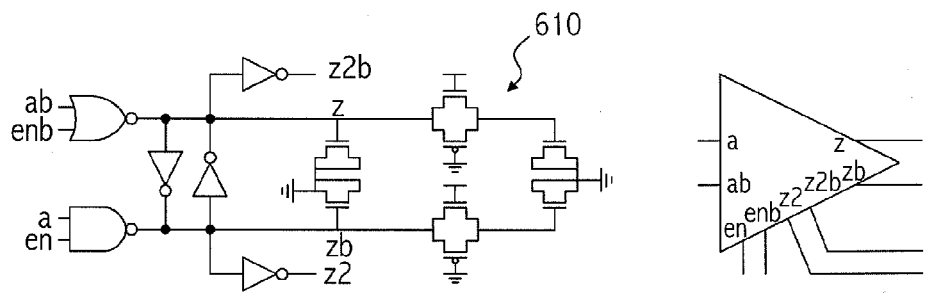
FIG. 6B illustrates an exemplary dummy delay element used in the reset circuit.
Figure 6C:
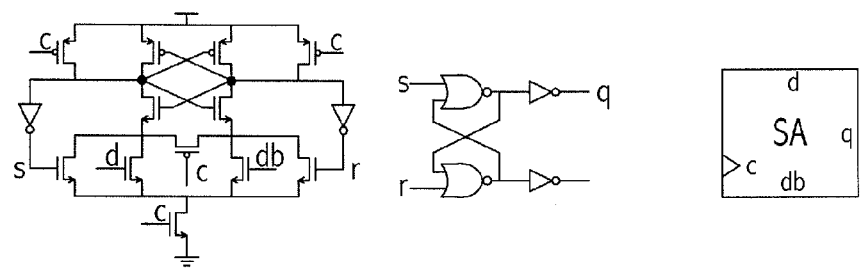
FIG. 6C illustrates an exemplary sense amplifier latch used in an embodiment of the ring oscillator.

FIG. 6A illustrates an exemplary differential delay element 600 that may be used in an RO such as the one shown in FIG. 3. Two sense amps 601 and 603 are used to latch the two bits of information provided by each RO stage. The transmission gates 606 and 607 are faster than the inverter, which gives rise to an intermediate value and thus higher resolution as explained in association with the single-ended version of FIG. 4. The symbol 602 represents the implementation shown in FIG. 6A. Other implementations are of course possible, as would be readily known to those of skill in the art. FIG. 6B shows an exemplary implementation of a dummy delay element 610 that may be used in the pulse generator 501 shown in FIG. 5. FIG. 6C illustrates an exemplary sense-amp type flip-flop that may be used in the differential delay element 600.

Figure 7A:
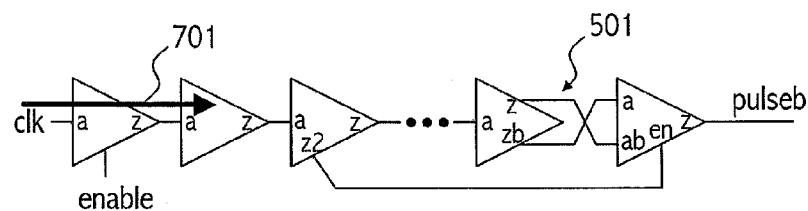
FIGS. 7A, 7B, and 7C illustrate the beginning of a measurement cycle.
Figure 7B:
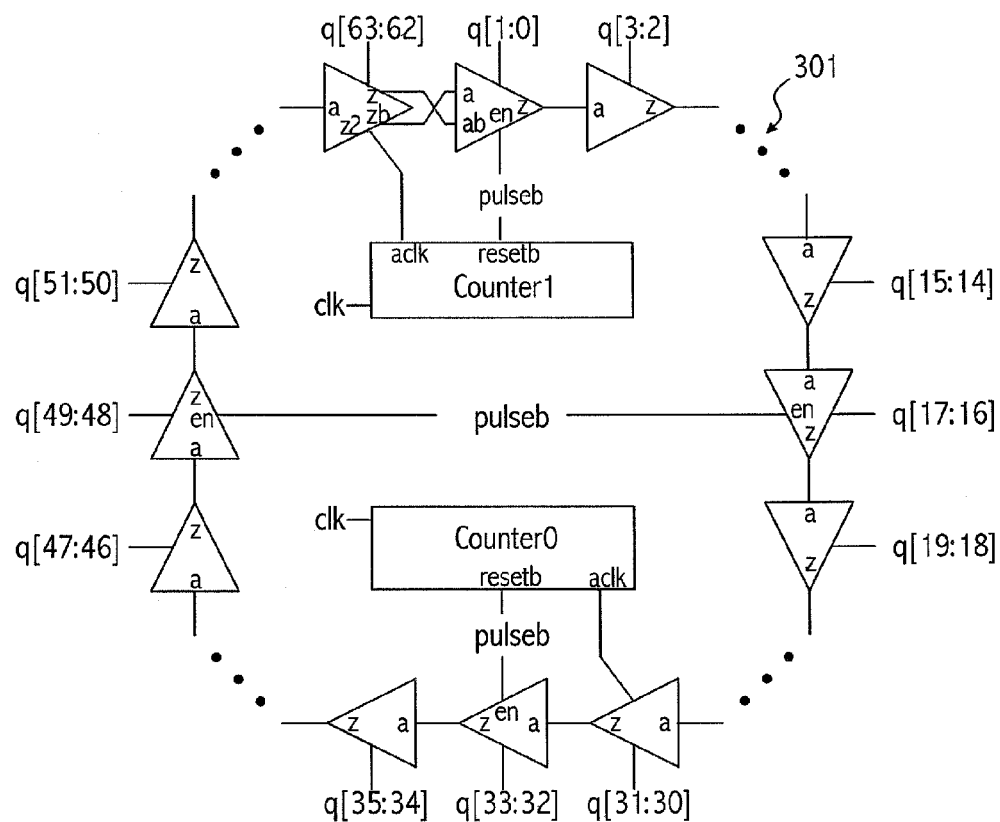
Figure 7C:
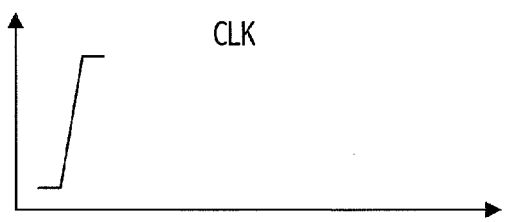

FIGS. 7A through 7C illustrate operation of the power supply monitor PSM at the beginning of the clock cycle. FIG. 7A shows the pulse generator 501, FIG. 7B shows the ring oscillator 301, and FIG. 7C illustrates the clock defining the evaluation period for the power supply monitor. As the edge of the clock cycle enters the pulse generator as represented by 701 at the beginning of the clock cycle, the output of the PSM most significant bits (MSBs) and least significant bits (LSBs) are undefined, as is the output of the encoder 109.

Figure 8A:
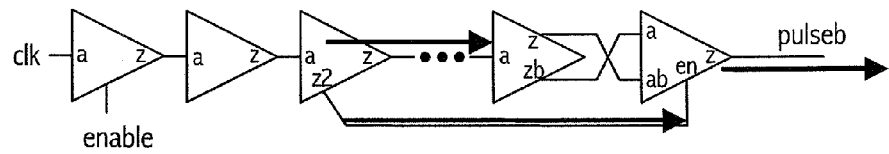
FIGS. 8A, 8B, and 8C illustrate reset of the ring oscillator near the beginning of the measurement cycle.
Figure 8B:
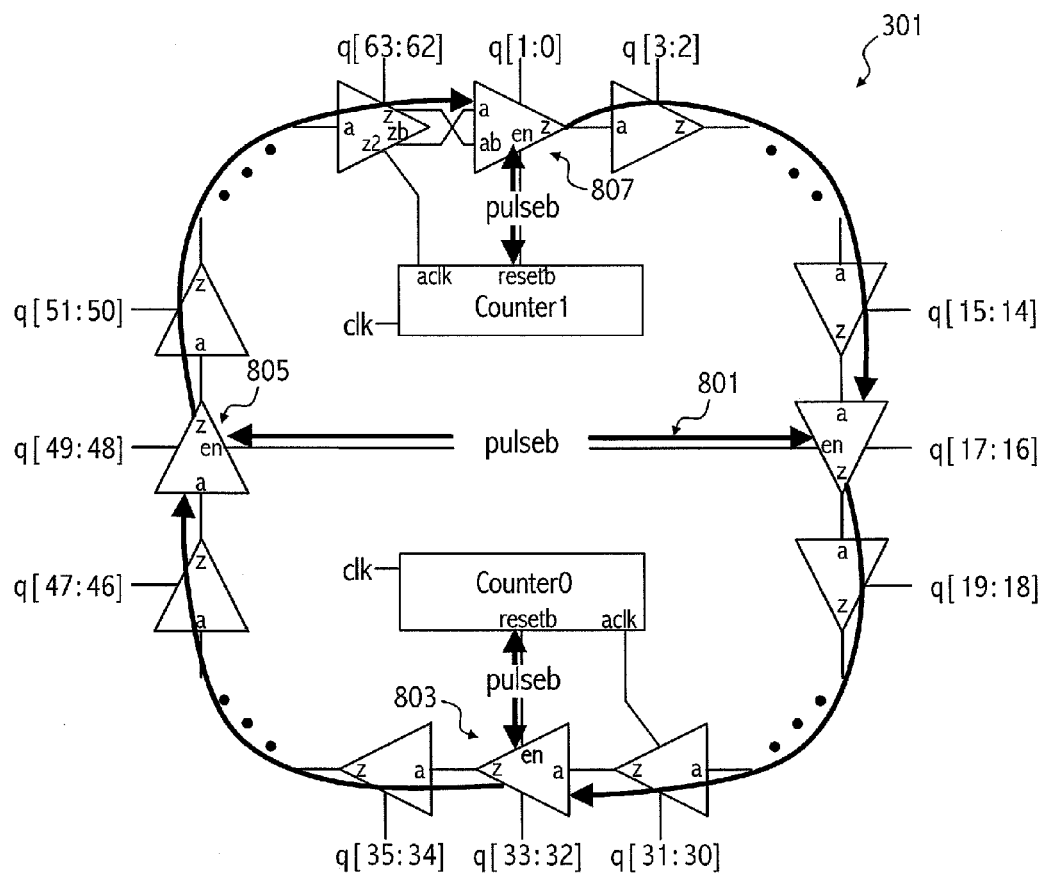
Figure 8C:
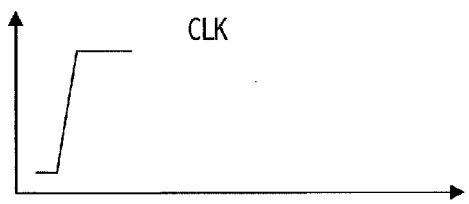

FIGS. 8A through 8C illustrate operation of the power supply monitor during the reset portion of the clock cycle after the reset signal pulseb is generated by the pulse generator 501. As indicated by the heavy black lines, the reset pulse enters the ring oscillator at four places: 801, 803, 805, and 807. The reset pulse traverses the ring oscillator to place the ring oscillator in a known state. In addition, the counters are also reset.

Figure 9A:
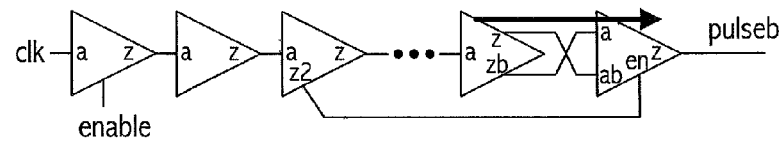
FIGS. 9A, 9B, and 9C illustrate the end of the reset pulse and the beginning of oscillations in the ring oscillator.
Figure 9B:
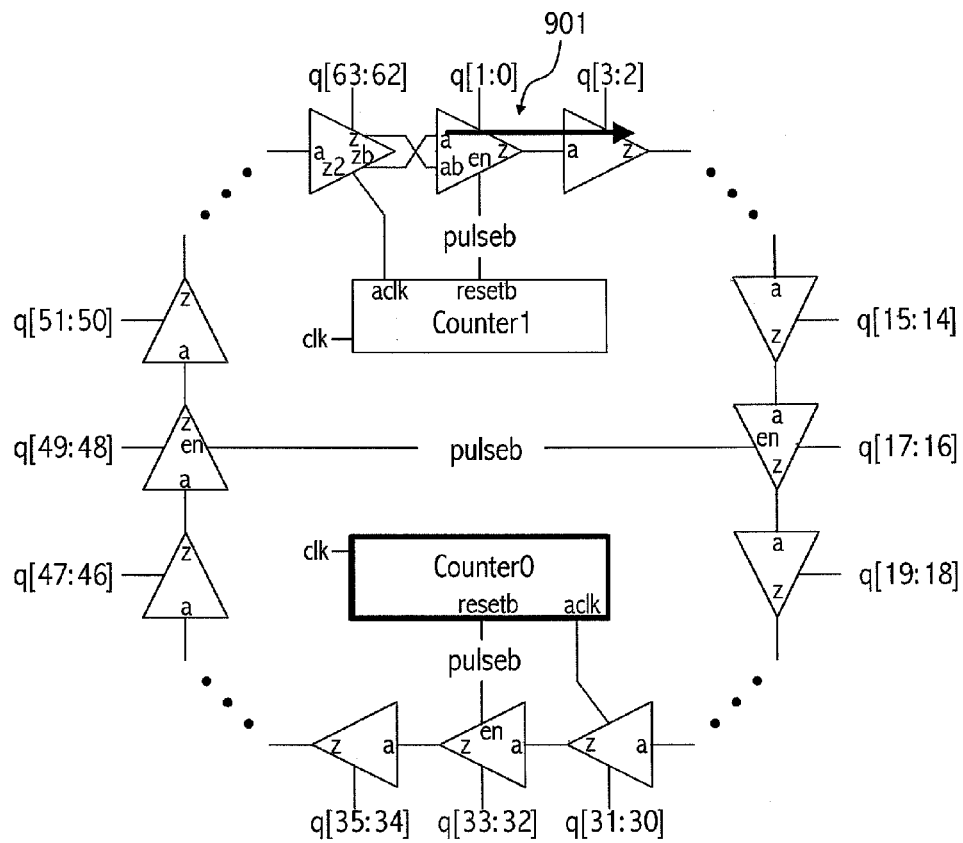
Figure 9C:
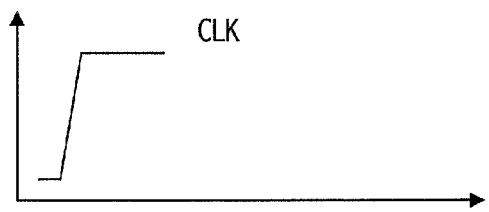

Referring to FIGS. 9A through 9C, as the reset pulse ends, the RO oscillations begin as indicated at 901. In order to account for the delay through the pulse generator, the PSM output starts at a value corresponding to the length of the reset pulse, which was one RO revolution in the illustrated embodiment. In an embodiment, that may be accomplished by coding the encoder such that a value corresponding to the length of the pulse generator is output as the first value. In still other embodiments, the voltage values that correspond to the PSM output may be determined with the reset delay excluded. At the beginning of the oscillations in FIG. 9B, the PSM MSB output is 0, the PSM LSB output is 64, corresponding to the length of the reset pulse, and the encoded PSM output 110 (FIG. 1) is 64.

Figure 10A:
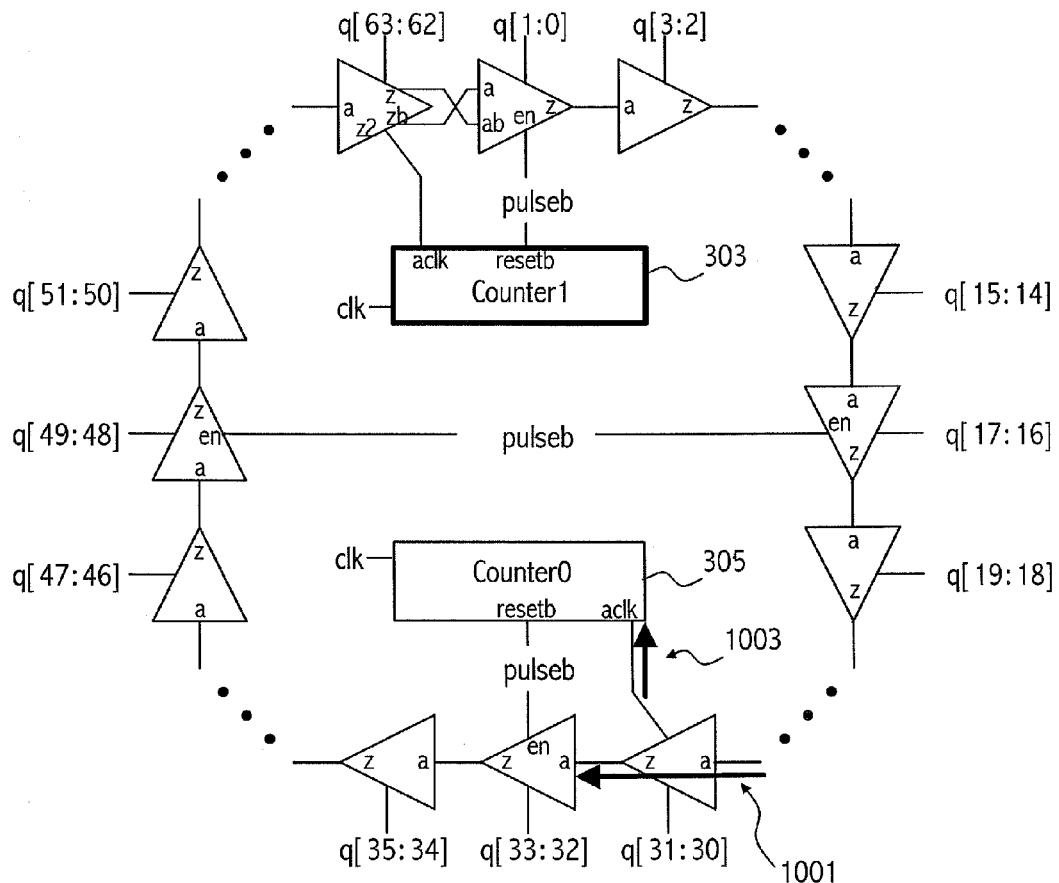
FIGS. 10A and 10B illustrate continuation of oscillations in the ring oscillator.
Figure 10B:
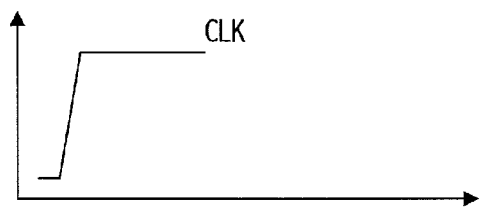

Referring to FIGS. 10A and 10B, the oscillations continue as shown at 1001. The counter0 305 increments as shown at 1003. At this point in the oscillations, the PSM MSB output is 0, the PSM LSB output is 96 (corresponding to 32 from the RO and 64 from the pulse generator), and the encoded PSM output is 96. As counter1 303 is the least recently incremented counter, that counter is the valid counter.

Figure 11A:
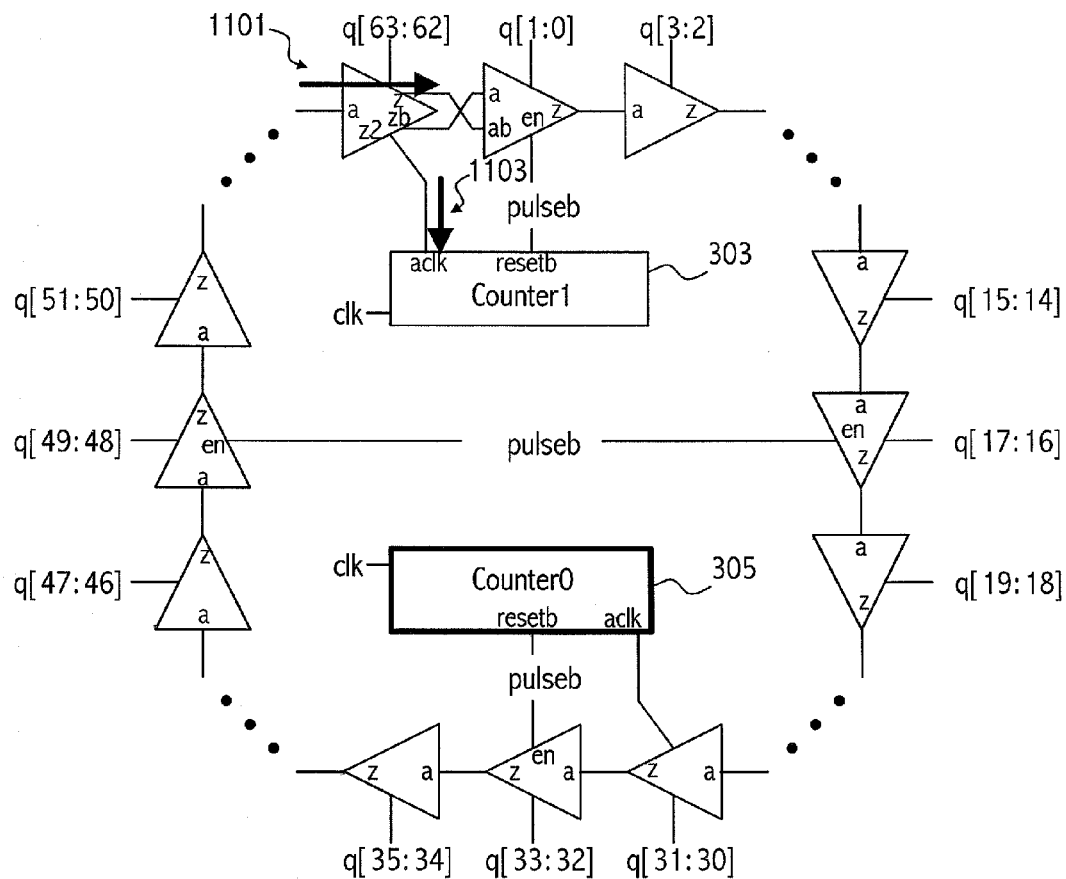
FIGS. 11A and 11B illustrate continuation of oscillations in the ring oscillator.
Figure 11B:
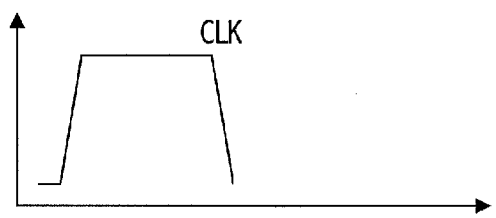

Referring to FIGS. 11A and 11B, the oscillations continue as shown at 1101. The counter1 303 increments as shown at 1103. As counter0 305 is the least recently used counter, that counter is now the valid counter.

At this point in the oscillations, the PSM MSB output is 1, indicative of a revolution through the ring oscillator, the PSM LSB output is 0, and the encoded PSM output is 128. As shown in FIG. 11B, the clock has completed approximately half its cycle.

Figure 12A:
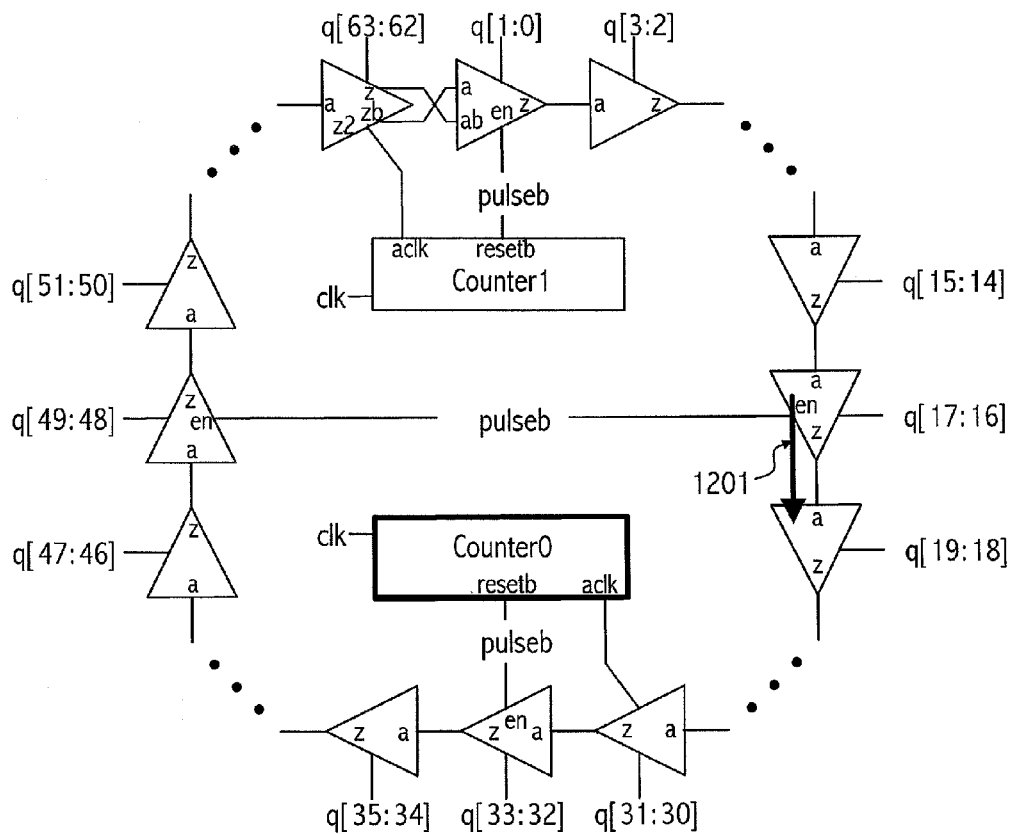
FIGS. 12A and 12B illustrate continuation of oscillations in the ring oscillator.
Figure 12B:
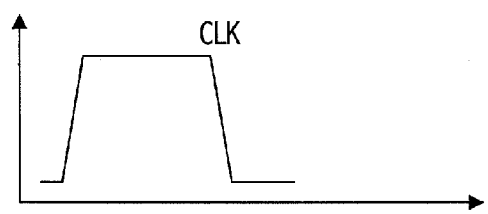

Referring to FIGS. 12A and 12B, the oscillations continue with the leading edge of the oscillation signal traversal through the ring oscillator shown at 1201. FIG. 12B assumes one and a quarter revolutions since the state of the RO shown in FIG. 11B. Note that zeros were traversing the ring oscillator due to the inversion at the top of the ring oscillator for that revolution (not shown) and in the illustrated embodiment, the counters do not increment on the negative edge. At 1201, after an additional one and a quarter revolutions, with the counters not incrementing on the negative edge, the PSM MSB output is still 1, the PSM LSB output is 80, and the encoded PSM output is 208.

Figure 13A:
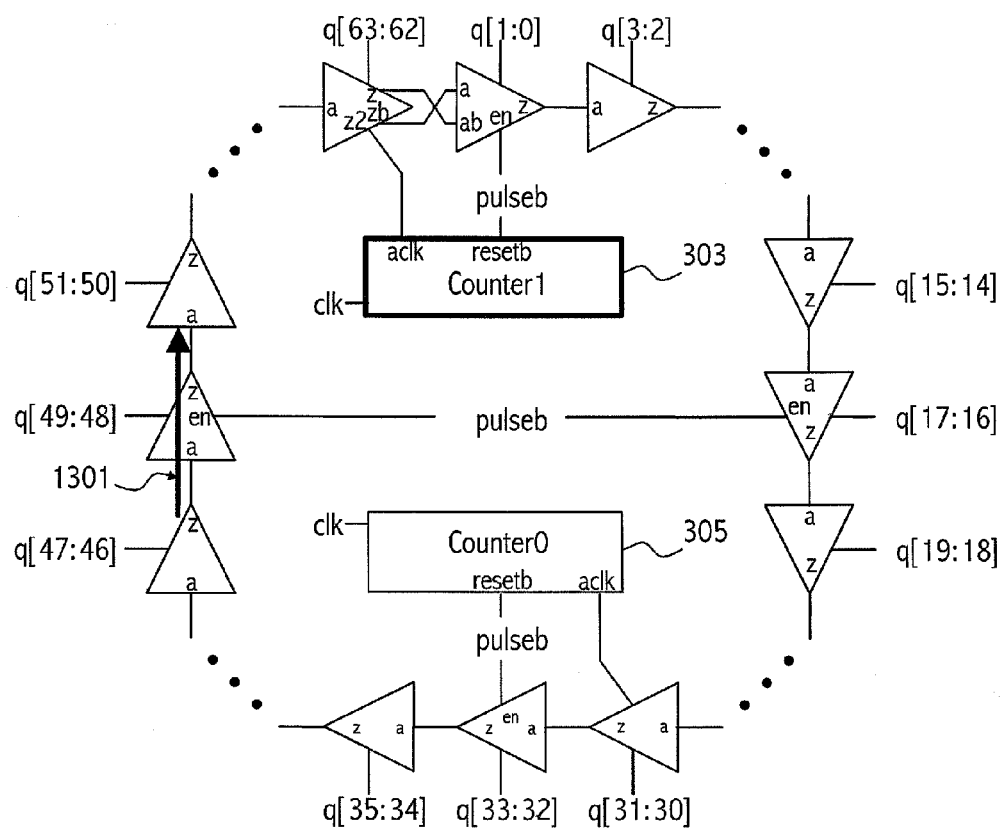
FIGS. 13A and 13B illustrate the end of oscillations in the ring oscillator at the conclusion of the clock cycle.
Figure 13B:
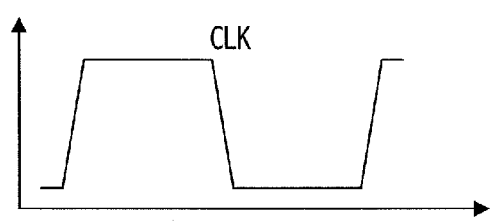

Referring to FIGS. 13A and 13B, the clock cycle ends as shown in FIG. 13B. The counter values are latched and the state of the RO is latched. As counter2 305 has incremented again, counter1 303 is the valid counter. At the end of the clock cycle, the PSM MSB output is 1, the PSM LSB output is 112, and the encoded PSM output is 240.

While the embodiment shown in FIGS. 7A-7C contemplates a reset circuit that initializes the ring oscillator at the beginning of the measurement period, other embodiments may maintain the ring oscillator in an initialized state prior to the beginning of the measurement period and allow the ring oscillator to begin oscillating at the beginning of the measurement period.

Figure 14:
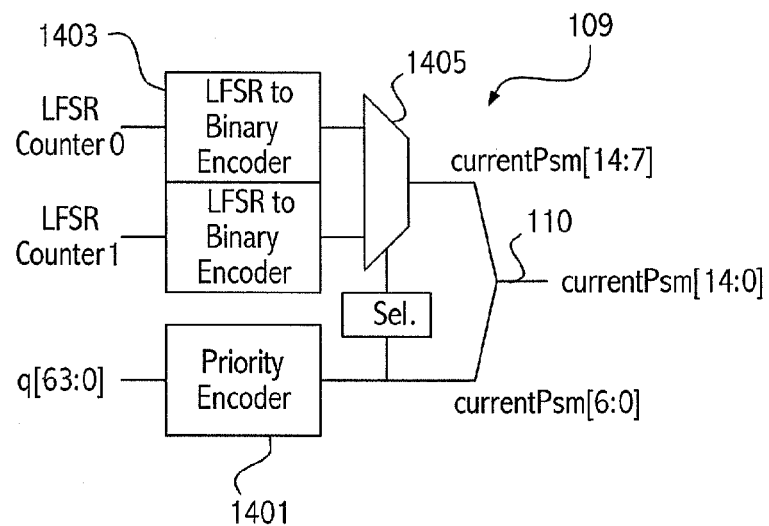
FIG. 14 illustrates an encoder used to convert the counters and ring oscillator state to an output value.

FIG. 14 illustrates an exemplary PSM encoder 109 that provides the PSM output 110. The RO state is outputted as a level-sensitive thermometer code that indicates the leading edge of the traversal of the ring oscillator and is converted to a binary number using a priority encoder 1401. That value is concatenated with the binary output of one of the RO counters to create the complete current PSM output. If LFSR counters are used, the LFSR values are converted to binary in the LFSR to binary encoders 1403. If regular counters are used, the LFSR conversion is omitted. A multiplexer 1405 selects the valid counter (least recently updated) based on the output of the priority encoder 1401. In the illustrated embodiment, the high order bits of the PSM output are provided by the valid counter and the low order bits by the thermometer code of the ring oscillator. For the illustrated embodiment, the PSM output sequence is linear and monotonic.

Figure 15A:
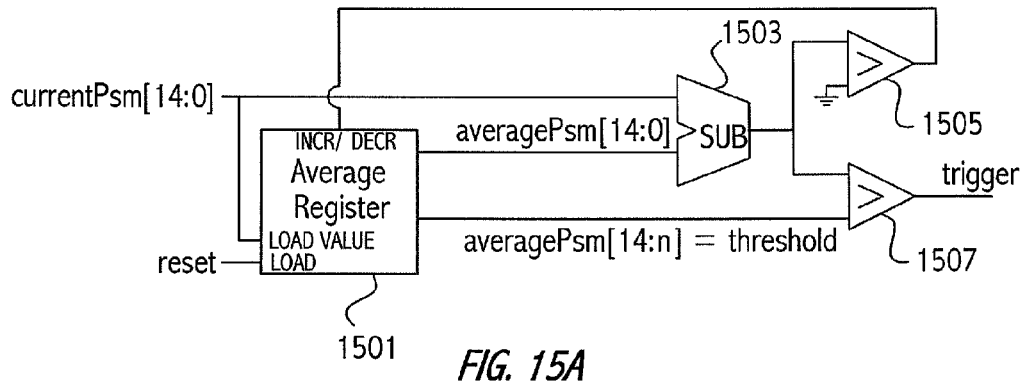
FIG. 15A illustrates an averaging and trigger circuit for use in an embodiment of the invention.

FIG. 15A illustrates an averaging circuit that may be used for such applications as real-time triggering and calibration. In FIG. 15A, the current PSM value (corresponding to the last complete measuring period) may be loaded into the average register 1501, e.g., at reset of the average circuit, e.g., the average circuit can be reset at programmed supply voltage changes. The current PSM output is compared with its time-averaged value. This average value is computed using an up-down counter. If the current PSM output is larger than the average value, then the average value is incremented. Similarly, if the current PSM output is smaller, then the average value is decremented. In FIG. 15A that is implemented, e.g., by subtracting the average value from the current PSM output in subtractor 1503. That difference is then compared in comparator 1505 to determine whether to increment or decrement the average value.

The PSM output may be used to provide a trigger when a sudden delay change is indicated by the value of the PSM. The sudden delay change, e.g., a delay increase meaning that the traversal through the ring oscillator should have a smaller value than average, may indicate a power supply (L di/dt) event, causing a voltage droop. When the power supply droops, the ring oscillator will run more slowly so a lower value will be output by the PSM. A trigger may be generated when the delay increases by a predetermined percentage of the average value or the current value of the PSM.

A trigger threshold may be calculated by subtracting the current PSM value from the MSBs [14:n] of the average value in subtractor 1503, where n corresponds to the amount of shift (a divide) of the average value and thus the threshold. The threshold (the shifted value) is compared to the difference between the current PSM output and the average PSM output in comparator 1507. For example, n=4 corresponds to a divide by 16, which would cause the threshold to be a 6.25% of the average PSM value.

The threshold value for a power supply event can be programmed from the test infrastructure or calculated on-chip during calibration. During calibration a value K is calculated and represents a 100% voltage droop. That value can be calculated on-chip with a subtraction circuit and shifter as shown in FIG. 15. Since the $V_{DD}$ droop as a percentage is approximated as linearly related to the difference in current and average PSM output, the threshold can be calculated directly from K. For example, a 6.25% droop is detected when the difference in PSM outputs exceeds K/16.

The PSM may be used in conjunction with architectural or circuit techniques to prevent catastrophic failure during power supply noise events. That requires real-time droop detection. After two-point calibration (described later herein), the $V_{DD}$ droop as a percentage of the nominal $V_{DD}$ can be calculated by subtracting current PSM output from average PSM output as described above. By comparing this difference to a threshold value, a trigger signal indicating a power supply noise event can be generated. That trigger signal can be placed on a bus to initiate architectural mechanisms, such as frequency scaling or workload throttling to prevent failure. It can enable circuit techniques for mitigating supply noise, such as active decoupling circuits. Decoupling capacitors are capacitors added to the circuit as charge reservoirs. Active decoupling refers to a circuit that switches in charged capacitors on demand during a voltage droop. For voltage overshoots, it is possible to switch out capacitance to address the overshoot.

The current PSM value can be streamed out onto a debug bus to recreate the $V_{DD}$ waveform. However, if there is little noise on the supply voltage, then the PSM output will not be of interest and debug resources can be freed. In one approach to limit traffic on the debug bus, to determine if a $V_{DD}$ droop or overshoot has occurred, and thus the $V_{DD}$ waveform is interesting, the minimum and maximum value of the PSM may be recorded over a time interval. Those values can be read by the debug bus to determine if the test conditions were interesting and should be repeated while gathering $V_{DD}$ waveform information.

Figure 15B:
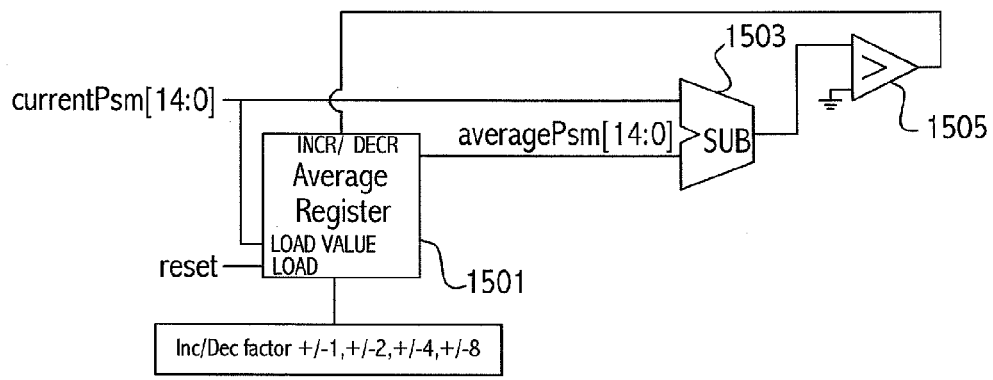
FIG. 15B illustrates another embodiment of an averaging circuit for use in an embodiment of the invention.
Figure 15C:
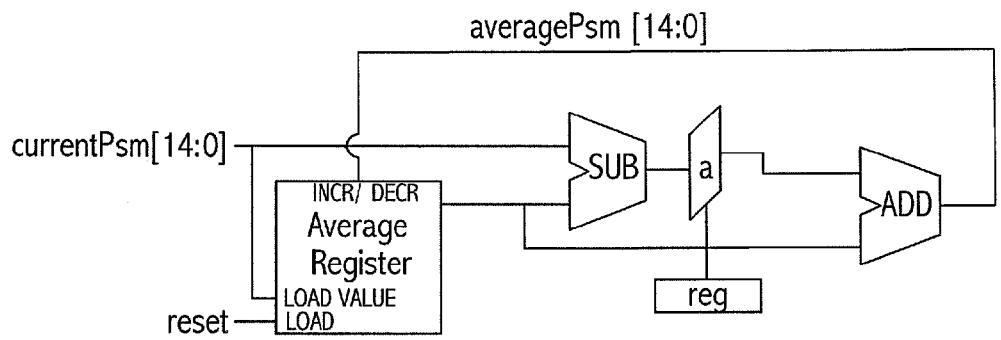
FIG. 15C illustrates another embodiment of an averaging circuit for use in an embodiment of the invention.

FIG. 15B illustrates another embodiment of an averaging circuit in which the increment/decrement values adjust according to the output of comparator 1505. FIG. 15C illustrates another embodiment of an averaging circuit in which an averaging circuit is implemented using an infinite impulse response (IIR) moving average circuit.

Figure 15D:
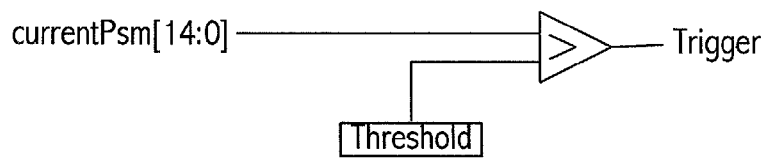
FIG. 15D illustrates an embodiment of a trigger circuit that compares a current PSM output to a threshold.

Another embodiment as shown in FIG. 15D utilizes a PSM threshold without an average. Such an embodiment may be simpler to implement as it omits the averaging circuit. In such an embodiment the current PSM output is compared to a threshold value. The threshold can be computed by running the PSM with no load at a known voltage that is predetermined to be the minimum operating voltage of the chip at a particular frequency, and the computed threshold value can then be stored in a nonvolatile memory location, e.g., a fused register. That stored value can be scaled to other clock frequencies, e.g., at runtime, and used as the threshold for comparison to the PSM output.

Figure 16:
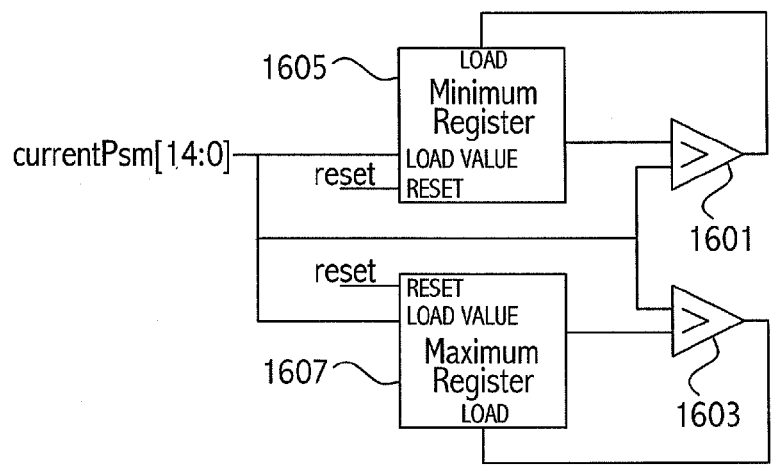
FIG. 16 illustrates a minimum and maximum detection circuit for use in an embodiment of the invention.

Referring to FIG. 16, an exemplary embodiment shows a circuit that monitors maximum and minimum PSM output values. The current PSM output is supplied to comparators 1601 and 1603, which respectively compare the current PSM output to saved minimum values and maximum values stored in registers 1605 and 1607. If a new minimum or new maximum is found, the appropriate registers are updated. Using the minimum and maximum detection can determine if any significant $V_{DD}$ noise event has occurred, find worst case timing/reliability operating conditions, and reduce debug bus traffic since the maximum/minimum is determined on-chip.

As stated earlier, process and temperature can also affect the delay through the ring oscillator and can be calibrated out. The PSM output can be mapped to VDD by exhaustively sweeping VDD and recording the corresponding PSM output in a look-up table (LUT). During normal operation, the VDD is determined by finding the PSM output and corresponding VDD in the LUT. That process should be performed on at least one PSM for each chip to calibrate for global process variations.

Temperature also has an effect on the PSM output. For the most accurate results, a look-up table can be generated for all temperatures of interest. Then during normal operation, thermal sensors already included in most designs can be used to determine the temperature and the correct look-up table to use for VDD mapping. Alternatively, the effects of temperature can be ignored, introducing error in the PSM measurement as a measure of voltage transients, but accurate with regards to circuit performance as a function of voltage and temperature.

Another calibration approach is a two-point calibration approach that compensates for process and temperature effects by comparing the PSM output with its average value. The average value is assumed to occur at the nominal VDD. That assumption holds if there is no constant IR drop in the power grid. An exemplary average circuit to calculate the average PSM value is shown in FIG. 15. For small VDD droops, the difference between a PSM output and its average value is almost linearly related to the VDD droop as a percentage of the nominal VDD. Moreover, the slope and y-intercept of the line of best fit are approximately the same.

The unknown parameter K in the line of best fit can be calculated from the PSM output at two known supply voltages. For example, this value can be recorded at 100% and 75% of the VDD of interest. The unknown parameter can then be calculated using Equations (1) and (2), which requires subtracting PSM outputs and shifting the result. The PSM VDD measurement can then be calculated using Equations (3) and (4).

$$K(1.00 - 0.75) = PSM_{1.00} - PSM_{0.75} \tag{1}$$
$$K = \frac{PSM_{1.00} - PSM_{0.75}}{1.00 - 0.75}$$

$$K = 4[PSM_{1.00} - PSM_{0.75}] \tag{2}$$

$$PSM_{AVG} - PSM = -K\frac{VDD}{VDD_{AVG}} + K \tag{3}$$

$$VDD = VDD_{AVG}\frac{K + PSM - PSM_{AVG}}{K} \tag{4}$$

$$\left(\frac{VDD}{VDD_{AVG}}\right)K = K + PSM - PSM_{AVG}$$

While the look-up table approach is more test-intensive than the two-point calibration method described above, it provides more accurate results. Any particular calibration approach utilized depends on the requirements of the particular system.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. An apparatus comprising:
   a ring oscillator including a plurality of serially coupled stages;
   storage elements to store respective values of respective stages;
   at least one counter to count a number of ring oscillator revolutions during a measurement period; and
   an encoder to provide an encoder output based on the at least one counter and the storage elements, the encoder output indicative of a number of stages of the ring oscillator traversed by an oscillation signal during the measurement period.

2. The apparatus as recited in claim 1 further comprising two counters to count the number of oscillator revolutions, each counter clocked by a different one of the stages.

3. The apparatus as recited in claim 2 wherein a particular one of the counters that least recently incremented is a valid counter at the end of the measurement period.

4. The apparatus as recited in claim 2 wherein the counters are linear feedback shift registers.

5. The apparatus as recited in claim 1 wherein the storage elements are configured to latch respective values from their corresponding stage at the end of the measurement period.

6. The apparatus as recited in claim 5 wherein the storage elements provide a thermometer code indicating a state of the ring oscillator at the end of the measurement period.

7. The apparatus as recited in claim 1 wherein the measurement period is one clock cycle of an integrated circuit.

8. The apparatus as recited in claim 1 further comprising a reset circuit coupled to provide a reset pulse at the beginning of the measurement period to initialize the ring oscillator and the at least one counter to a known state, the reset circuit including a pulse generator formed by stages, each stage having a delay corresponding to a delay through a stage of the ring oscillator.

9. The apparatus as recited in claim 8 wherein the encoder output includes a delay caused by the reset circuit.

10. The apparatus as recited in claim 1 wherein one of the stages is coupled to another of the stages so as to provide an inversion in the ring oscillator.

11. The apparatus as recited in claim 1 further comprising:
transmission gates disposed between nodes in adjacent stages in the ring oscillator;
a storage to store a value at a node of the transmission gates at the end of the measurement period.

12. The apparatus as recited in claim 1 wherein the encoder supplies an output in which a value of the at least one counter is used to provide a first portion of the encoder output and the ring oscillator storage elements are used to provide a second portion of the encoder output.

13. The apparatus as recited in claim 1 further comprising an averaging circuit coupled to receive a current output of the encoder and provide a moving average of encoder outputs.

14. The apparatus as recited in claim 1 further comprising a trigger circuit to generate a trigger signal when delay in the ring oscillator changes by a predetermined amount from an average value of the monitor output.

15. The apparatus as recited in claim 1 further comprising a trigger circuit to generate a trigger signal when the encoder output is above a predetermined threshold.

16. A method for monitoring a power supply comprising:
during a measurement period counting a number of revolutions of an oscillation signal through a ring oscillator in one or more counters;
responsive to an end of the measurement period, storing a value representative of a state of each stage of the ring oscillator;
generating an output signal indicative of a number of stages through which an oscillator signal has traversed during the measurement period, using the stored values of the ring oscillator stages and a count value from one of the one or more counters.

17. The method as recited in claim 16 further comprising:
responsive to a first clock signal transition indicating a start of the measurement period, resetting the ring oscillator for a period of time with a reset signal; and
following the period of time, allowing the ring oscillator to oscillate.

18. The method as recited in claim 17 further comprising:
generating the reset signal in a pulse generator circuit having stages, each pulse generator stage having a nominal delay equal to a nominal delay of a stage of the ring oscillator;
initializing the ring oscillator and the one or more counters with the reset signal.

19. The method as recited in claim 18 further comprising accounting for delay in the reset circuit in the output signal, thereby ensuring that the output signal has a value that reflects the number of transitions and the delay.

20. The method as recited in claim 16 further comprising:
counting in a first and second counter the number of oscillator revolutions;
clocking the first and second counters with a respective transition through a different one of the stages; and
determining one of the first and second counters as a valid counter according to which of the counters least recently incremented.

21. The method as recited in claim 16 wherein the evaluation period is one clock cycle of an integrated circuit.

22. The method as recited in claim 16 further comprising generating an average monitor output by incrementing or decrementing a counter according to whether a current monitor output is greater than or less than the average monitor output.

23. The method as recited in claim 22 further comprising providing a trigger signal when the monitor output changes by a predetermined amount from the average monitor output.

24. A method for monitoring a power supply comprising:
determining how many stages of a ring oscillator an oscillator signal traverses during a measurement period, the determining including,
counting how many revolutions of the ring oscillator the oscillator signal makes during the measurement period; and
latching a current state of each stage at the end of the measurement period to provide an indication of how many stages have been traversed in a current revolution underway at the end of the measurement.

25. A tangible computer-readable medium storing a computer readable representation of an integrated circuit, the computer readable representation comprising:
a ring oscillator including a plurality of serially coupled stages;
storage elements to store respective values of respective stages;
at least one counter to count a number of ring oscillator revolutions during a measurement period; and
an encoder coupled to provide an encoder output according to the at least one counter and the storage elements, the encoder output indicative of a number of stages of the ring oscillator traversed by an oscillation signal during the measurement period.

* * * * *